(12) United States Patent
Choi

(10) Patent No.: US 8,466,616 B2
(45) Date of Patent: Jun. 18, 2013

(54) FLAT PANEL DISPLAY DEVICE AND ENCAPSULATION SUBSTRATE THEREOF

(75) Inventor: Jung-Mi Choi, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 105 days.

(21) Appl. No.: 13/009,911

(22) Filed: Jan. 20, 2011

(65) Prior Publication Data
US 2011/0241528 A1    Oct. 6, 2011

(30) Foreign Application Priority Data

Apr. 1, 2010   (KR) .......................... 10-2010-0029998

(51) Int. Cl.
*H01J 1/62* (2006.01)
*H01J 63/04* (2006.01)

(52) U.S. Cl.
USPC ........... 313/512; 313/504; 313/506; 313/553; 313/561

(58) Field of Classification Search
USPC .......................... 313/504, 506, 512, 553, 561
See application file for complete search history.

(56) References Cited

U.S. PATENT DOCUMENTS

| | | | | |
|---|---|---|---|---|
| 6,998,776 B2* | 2/2006 | Aitken et al. | ................. | 313/512 |
| 7,019,458 B2* | 3/2006 | Yoneda | ................. | 313/512 |
| 7,407,423 B2* | 8/2008 | Aitken et al. | .................. | 445/25 |
| 7,545,094 B2* | 6/2009 | Choi et al. | .................... | 313/504 |
| 7,838,314 B2* | 11/2010 | Choi et al. | ...................... | 438/30 |
| 7,868,540 B2* | 1/2011 | Kim | ............................... | 313/504 |
| 8,021,205 B2* | 9/2011 | Lee et al. | ........................ | 445/25 |
| 8,038,495 B2* | 10/2011 | Lee et al. | ........................ | 445/23 |
| 8,093,603 B2* | 1/2012 | Jung et al. | ........................ | 257/88 |
| 2002/0070663 A1* | 6/2002 | Ogura et al. | .................. | 313/506 |
| 2004/0004436 A1* | 1/2004 | Yoneda | ...................... | 313/512 |
| 2004/0069017 A1* | 4/2004 | Li et al. | ............................ | 65/43 |
| 2004/0191566 A1* | 9/2004 | Kikuchi et al. | ............... | 428/690 |
| 2005/0285518 A1* | 12/2005 | Cok | ............................... | 313/512 |

(Continued)

FOREIGN PATENT DOCUMENTS

| | | |
|---|---|---|
| KR | 10-0500607 | 7/2005 |
| KR | 10-2006-0028212 | 3/2006 |

(Continued)

OTHER PUBLICATIONS

The Korean Office action issued by Korean Industrial Property Office on Jul. 27, 2011, corresponding to KR 10-2010-0029998 and Request for Entry attached herewith.

*Primary Examiner* — Nimeshkumar Patel
*Assistant Examiner* — Thomas A Hollweg
(74) *Attorney, Agent, or Firm* — Robert E. Bushnell, Esq.

(57) ABSTRACT

A flat panel display device having an improved encapsulation structure includes a glass substrate; a light emission unit formed on the glass substrate; an encapsulation substrate formed on the glass substrate; and frit sealing a space between the glass substrate and the cover layer. The encapsulation unit includes a metal layer formed of a metallic material and a cover layer stacked on the metal layer and formed of a glass material in order to cover the light emission unit. In the above encapsulation structure, pressure resistance and vapor permeability resistance of a flat panel device may be improved and thus deterioration of a light emission unit due to permeation of moisture may be prevented. Also, heat radiation capacity may be improved and thus deterioration in performance of a product may be prevented.

14 Claims, 2 Drawing Sheets

U.S. PATENT DOCUMENTS

| | | |
|---|---|---|
| 2006/0097633 A1 | 5/2006 | Cho et al. |
| 2006/0132034 A1 | 6/2006 | Cho et al. |
| 2007/0007894 A1* | 1/2007 | Aitken et al. ............... 313/512 |
| 2007/0090759 A1* | 4/2007 | Choi et al. .................. 313/512 |
| 2008/0143247 A1* | 6/2008 | Kim et al. ................... 313/504 |
| 2008/0169750 A1* | 7/2008 | Kim et al. ................... 313/498 |
| 2008/0218066 A1* | 9/2008 | Kim ............................. 313/504 |
| 2009/0039780 A1* | 2/2009 | Kim et al. ................... 313/512 |
| 2009/0206739 A1* | 8/2009 | Lee et al. .................... 313/504 |
| 2009/0221109 A1* | 9/2009 | Choi et al. ..................... 438/33 |
| 2009/0261341 A1* | 10/2009 | Choi et al. ..................... 257/72 |
| 2010/0013071 A1 | 1/2010 | Chol et al. |
| 2010/0148192 A1* | 6/2010 | Jung et al. ...................... 257/88 |

FOREIGN PATENT DOCUMENTS

| | | |
|---|---|---|
| KR | 10-0637201 | 10/2006 |
| KR | 10-0669751 | 1/2007 |
| KR | 10-2009-0015482 | 2/2009 |
| KR | 10-2010-0008433 A | 1/2010 |

* cited by examiner

FLAT PANEL DISPLAY DEVICE AND ENCAPSULATION SUBSTRATE THEREOF

CROSS-REFERENCE TO RELATED APPLICATION

This application claims the benefit of Korean Patent Application No. 10-2010-0029998, filed on Apr. 1, 2010 in the Korean Intellectual Property Office, the disclosure of which is incorporated herein in its entirety by reference.

BACKGROUND

1. Field

Aspects of the present invention relate to a flat panel display device, and more particularly, to a flat panel display device having an improved encapsulation structure for preventing permeation of moisture from an external environment, and an encapsulation substrate for forming the encapsulation structure.

2. Description of the Related Art

Flat panel display devices such as organic light emitting display devices may have a thin and flexible structure, and thus, much research has been conducted for further development thereof. An organic light emitting display device includes a light emission unit that may deteriorate due to permeation of moisture. Thus, an encapsulation structure is needed for sealing the light emission unit to prevent permeation of moisture from an external environment.

In most typical encapsulation structures, a light emission unit is formed on a glass substrate. An encapsulation substrate is formed of the same glass material as the glass substrate and covers the light emission unit. A sealant is sealed between the glass substrate and the encapsulation substrate.

For example, a sealant such as an ultraviolet curing agent is coated on a glass substrate around a light emission unit. The glass substrate is covered by an encapsulation substrate. Then, an ultraviolet ray is irradiated to cure the sealant, thereby obtaining a sealing structure.

However, a vapor permeability resistance of a general sealant is greatly reduced in time, and thus its sealing effect subsides. Accordingly, in order to constantly maintain a sealing effect, a new sealing structure having excellent vapor permeability resistance is required.

Also, as current flat panel display devices have a large screen obtained by using a large surface area, a light emission unit having a large surface area may generate a great deal of heat. However, since a typical glass substrate and an encapsulation substrate are formed of only a glass material that has a low heat transfer speed, heat radiation may not take place appropriately. Thus, deterioration in performance of a product may occur if overheating is continued for a long time.

SUMMARY

Aspects of the present invention provide a flat panel display device having an encapsulation structure of which vapor permeability resistance and heat radiation capacity are improved, and an encapsulation substrate of the flat panel display device.

According to an aspect of the present invention, there is provided a flat panel display device including a glass substrate; a light emission unit formed on the glass substrate; an encapsulation substrate formed on the glass substrate, the encapsulation substrate including a metal layer formed of a metallic material; and a cover layer stacked on the metal layer and formed of a glass material in order to cover the light emission unit; and frit sealing a space between the glass substrate and the cover layer.

According to an aspect of the invention, the frit may be a glass material that is cured when exposed to a laser.

According to an aspect of the invention, the metal layer may include stainless steel or aluminum, and the cover layer may include soda lime glass.

According to an aspect of the invention, the metal layer may be formed at an inner side of the encapsulation substrate so as to face the glass substrate, and a surface area of the cover layer is greater than a surface area of the metal layer.

According to an aspect of the invention, the sealant or a desiccant may be disposed between the metal layer and the glass substrate.

According to an aspect of the invention, the sealant may be disposed in a partial region and a desiccant may be disposed in a remaining region between the metal layer and the glass substrate.

According to an aspect of the invention, the flat panel display device may further include a passivation layer formed on the light emission unit and protecting the light emission unit.

According to another aspect of the present invention, there is provided an encapsulation substrate of a flat panel display device, wherein the encapsulation substrate is formed on a glass substrate by stacking a metal layer formed of a metallic material and a cover layer formed of a glass material in order to cover a light emission unit.

According to an aspect of the invention, the metal layer may include stainless steel or aluminum, and the cover layer may include soda lime glass.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
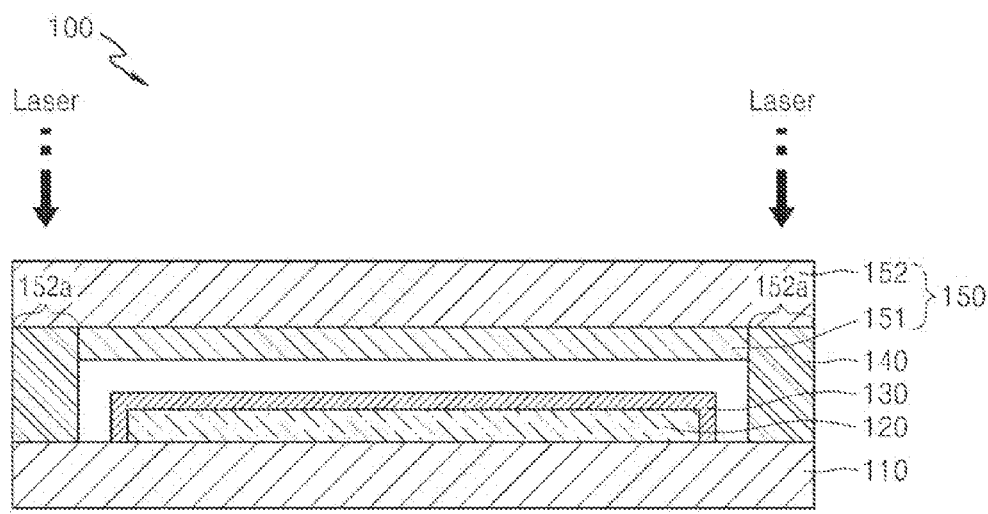
FIG. 1 is a cross-sectional view of a flat panel display device according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a cross-sectional view of a flat panel display device 100 according to an embodiment of the present invention. Referring to FIG. 1, the flat panel display device 100 includes a glass substrate 110, a light emission unit 120 formed on the glass substrate 110, and an encapsulation substrate 150 for covering the light emission unit 120. The light emission unit 120 may be an organic light emission unit including an organic layer formed between a pair of facing electrodes. However, the invention is not limited thereto.

The encapsulation substrate 150 covers the light emission unit 120 to prevent permeation of moisture or the like from an external environment. The encapsulation substrate 150 includes a metal layer 151 stacked on a cover layer, formed of a metallic material, e.g., stainless steel or aluminum. The metal layer 151 the cover layer 152 is formed of a glass material. The cover layer 152 has a surface area greater than that of the metal layer 151. Accordingly, although the metal layer 151 is formed at an inner side close to the glass substrate 110, a region 152a is exposed at edge portions of the flat panel display device 100 between the cover layer 152 and the glass substrate 110 as illustrated in FIG. 1. Frit 140 is filled in the exposed region 152a to seal the space between the glass substrate 110 and the encapsulation substrate 150.

The frit 140 is a glass material and is cured when exposed to a laser. Accordingly, when the frit 140 is filled in the exposed region 152a between the glass substrate 110 and the cover layer 152 and then is irradiated with a laser, the frit 140 is cured to firmly seal the space between the glass substrate 110 and the cover layer 152.

A passivation layer 130 is formed on the light emission unit 120. The passivation layer 130 functions as a protection layer for protecting the light emission unit 120 from heat, moisture and the like.

The flat panel display device 100 having the above-described structure may have the following effects. As the encapsulation substrate 150 including the metal layer 151 formed of a metallic material and the cover layer 152 formed of a glass material is used, advantages of two different layers may be obtained. That is, since metal has a heat transfer speed about thirty times greater than that of glass, heat radiation capacity may be greatly increased in comparison to a case when the encapsulation substrate 110 is formed of only a glass material. As such, heat generated from the light emission unit 120 may be easily radiated outside of the flat panel display device 100 via the metal layer 151, and thus, deterioration in performance of the flat panel display device 100 due to overheating may be sufficiently suppressed even though the light emission unit 120 has a large surface area.

Also, since the cover layer 152 formed of a glass material is stacked on the metal layer 151, the frit 140 may be used for sealing. That is, the frit 140 (i.e., a glass material) has pressure resistant strength and vapor permeability resistance superior to those of a general epoxy-based sealant. However, as described above, the frit 140 is cured when exposed to a laser and, in this case, heat is generated. After the frit 140 is filled between the metal layer 151 and the glass substrate 110 and then cured by using a laser, a deformation may occur due to different thermal expansion coefficients between a metallic material and a glass material. Accordingly, if the cover layer 152 formed of a material similar to that for forming the glass substrate 110 is stacked on the metal layer 151 and the frit 140 is filled and cured between the cover layer 152 and the glass substrate 110, a frit encapsulation structure capable of preventing deformation and providing excellent pressure resistance and vapor permeability resistance may be obtained.

In this case, the cover layer 152 of the encapsulation substrate 150 may be formed of a low-quality glass material (e.g., soda lime glass) instead of a high-quality glass material for forming the glass substrate 110. Soda lime glass may not be used to form the glass substrate 110 because sodium significantly contained therein may permeate into the light emission unit 120 during a manufacturing process, but may be appropriately used to form the cover layer 152 because the metal layer 151 blocks a surface of the cover layer 152 facing the light emission unit 120. Accordingly, a price may be more advantageous in comparison to a typical case.

Therefore, the flat panel display device 100 and the encapsulation substrate 150 may provide an encapsulation structure having excellent vapor permeability resistance, heat radiation capacity, and economic feasibility.

Figure 2:
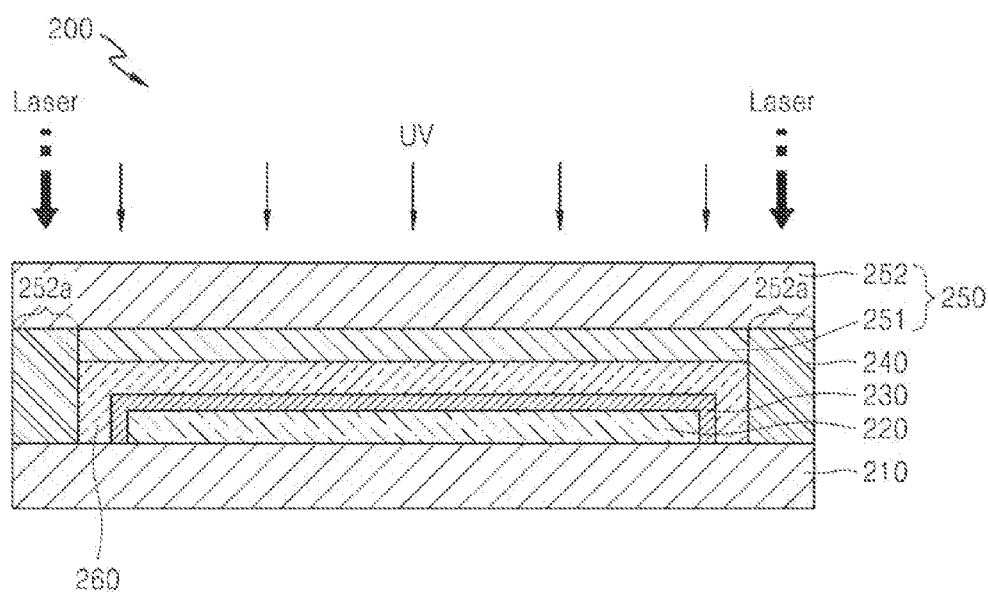
FIG. 2 is a cross-sectional view of a flat panel display device according to another embodiment of the present invention.

FIG. 2 is a cross-sectional view of a flat panel display device 200 according to another embodiment of the present invention. Referring to FIG. 2, the flat panel display device 200 includes a glass substrate 210, a light emission unit 220, and an encapsulation substrate 250. The light emission unit 220 may be an organic light emission unit in which an organic layer is formed between a pair of facing electrodes.

The encapsulation substrate 250 covers the light emission unit 220 to prevent permeation of moisture or the like from an external environment. The encapsulation substrate 250 includes a metal layer 251 stacked on a cover layer 252. The metal layer 251 is formed of a metallic material, such as stainless steel or aluminum. The cover layer 252 is formed of a glass material. The cover layer 252 has a surface area greater than that of the metal layer 251. Accordingly, although the metal layer 251 is formed at an inner side close to the glass substrate 210, a region 252a is exposed at edge portions of the flat panel display device 200 between the cover layer 252 and the glass substrate 210 as illustrated in FIG. 2.

Frit 240 is filled in the exposed region 252a to seal the space between the glass substrate 210 and the encapsulation substrate 250. The frit 240 is a glass material and is cured when exposed to a laser. Accordingly, after the frit 240 is filled in the exposed region 252a between the glass substrate 210 and the cover layer 252 and irradiated with a laser, the frit 240 is cured to firmly seal the space between the glass substrate 210 and the cover layer 252.

A sealant 260 is filled between the metal layer 251 and the glass substrate 210. The sealant 260 can be, for example, an ultraviolet curing agent. That is, after the sealant 260 is filled between the glass substrate 210 and the metal layer 251 and irradiated with an ultraviolet ray, the sealant 260 is cured to form a firm sealing structure together with the frit 240.

A passivation layer 230 is formed to cover the light emission unit 220. The passivation layer 230 functions as a protection layer for protecting the light emission unit 220 from heat, moisture and the like.

The flat panel display device 200 having the above-described structure may have the following effects. As the encapsulation substrate 250 including the metal layer 251 formed of a metallic material and the cover layer 252 formed of a glass material is used, advantages of two different layers may be obtained. That is, since metal has a heat transfer speed about thirty times greater than that of glass, heat radiation capacity may be greatly increased in comparison to a case when the encapsulation substrate 210 is formed of only a glass material. As such, heat generated from the light emission unit 220 may be easily radiated to outside the flat panel display device 200 via the metal layer 251, and thus, deterioration in performance of the flat panel display device 200 due to overheating may be sufficiently suppressed even though the light emission unit 220 has a large surface area.

Also, since the cover layer 252 formed of a glass material is stacked on the metal layer 251, the frit 240 may be used for sealing. That is, the frit 240 (i.e., a glass material) has a pressure resistant strength and vapor permeability resistance superior to those of a general epoxy-based sealant. However, as described above in relation to FIG. 1, the frit 240 is cured when exposed to a laser and, in this case, heat is generated. After the frit 240 is filled between the metal layer 251 and the glass substrate 210 and cured by using a laser, a deformation may occur due to different thermal expansion coefficients between a metallic material and a glass material. Accordingly, if the cover layer 252 formed of a material similar to that for forming the glass substrate 210 is stacked on the metal layer 251 and the frit 240 is filled and cured between the cover layer 252 and the glass substrate 210, a frit encapsulation structure capable of preventing deformation and providing excellent pressure resistance and vapor permeability resistance may be obtained.

In this case, the cover layer 252 of the encapsulation substrate 250 may be formed of a low-quality glass material instead of a high-quality glass material for forming the glass substrate 210. An example of such a low-quality glass material is soda lime glass. Soda lime glass may not be used to form the glass substrate 210 because sodium significantly contained therein may permeate into the light emission unit 220 during a manufacturing process, but may be appropriately used to form the cover layer 252 because the metal layer 251 blocks a surface of the cover layer 252 facing the light emission unit 220. Accordingly, a price may be more advantageous in comparison to a typical case.

Also, as the sealant 260 is filled between the metal layer 251 and the glass substrate 210, an encapsulation structure may be formed more firmly together with the frit 240.

Therefore, the flat panel display device 200 and the encapsulation substrate 250 may provide an encapsulation structure having excellent vapor permeability resistance, heat radiation capacity, and economic feasibility.

Figure 3:
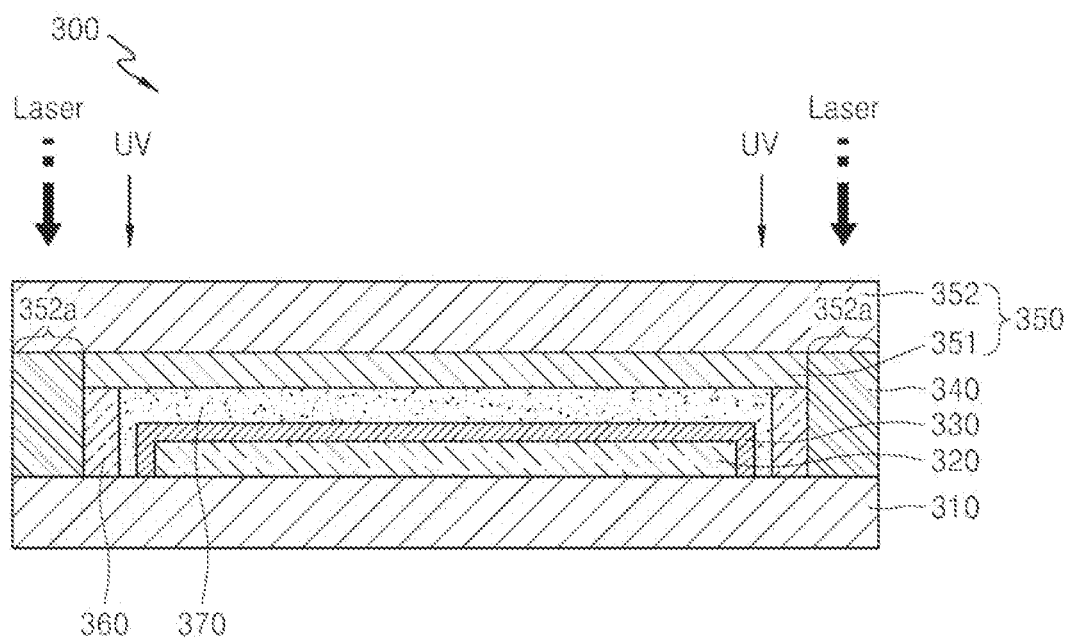
FIG. 3 is a cross-sectional view of a flat panel display device according to another embodiment of the present invention.

FIG. 3 is a cross-sectional view of a flat panel display device 300 according to another embodiment of the present invention. Referring to FIG. 3, the flat panel display device 300 includes a glass substrate 310, a light emission unit 320, and an encapsulation substrate 350. The light emission unit 320 may be an organic light emission unit including an organic layer formed between a pair of facing electrodes.

The encapsulation substrate 350 covers the light emission unit 320 to prevent permeation of moisture or the like from an external environment. The encapsulation substrate 350 includes a metal layer 351 stacked on a cover layer 352. The metal layer 351 is formed of a metallic material such as stainless steel or aluminum. The cover layer 352 is formed of a glass material. The cover layer 352 has a surface area greater than that of the metal layer 351. Accordingly, although the metal layer 351 is formed at an inner side close to the glass substrate 310, a region 352a is exposed at edge portions of the flat panel display device 300 between the cover layer 352 and the glass substrate 310 as illustrated in FIG. 3.

Frit 340 is filled in the exposed region 352a to seal the space between the glass substrate 310 and the encapsulation substrate 350. The frit 340 is a glass material and is cured when exposed to a laser. Accordingly, when the frit 340 is filled in the exposed region 352a between the glass substrate 310 and the cover layer 352 and then irradiated with a laser, the frit 340 is cured to firmly seal the space between the glass substrate 310 and the cover layer 352.

A sealant 360 is filled in an edge region and a desiccant 370 for absorbing moisture is filled in a remaining region between the metal layer 351 and the glass substrate 310. An example of the sealant 360 is an ultraviolet curing agent. That is, after the sealant 360 is filled in an edge region between the glass substrate 310 and the metal layer 351 and irradiated with an ultraviolet ray, the sealant 360 is cured to form a firm sealing structure together with the frit 340. Also, the desiccant 370 may absorb moisture that may permeate through the sealant 360, to prevent damage of the light emission unit 320 due to moisture.

A passivation layer 330 is formed to cover the light emission unit 320. The passivation layer 330 functions as a protection layer for protecting the light emission unit 320 from heat, moisture, and the like.

The flat panel display device 300 having the above-described structure may have the following effects. As the encapsulation substrate 350 including the metal layer 351 formed of a metallic material and the cover layer 352 formed of a glass material is used, advantages of two different layers may be obtained. That is, since metal has a heat transfer speed about thirty times greater than that of glass, heat radiation capacity may be greatly increased in comparison to a case when the encapsulation substrate 310 is formed of only a glass material. As such, heat generated from the light emission unit 320 may be easily radiated to outside the flat panel display device 300 via the metal layer 351 and thus deterioration in performance of the flat panel display device 300 due to overheating may be sufficiently suppressed even though the light emission unit 320 has a large surface area.

Also, since the cover layer 352 formed of a glass material is stacked on the metal layer 351, the frit 340 may be used for sealing. That is, the frit 340 has pressure resistant strength and vapor permeability resistance superior to those of a general epoxy-based sealant. An example of the frit 340 is a glass material. However, as described above, the frit 340 is cured when exposed to a laser and, in this case, heat is generated. After the frit 340 is filled between the metal layer 351 and the glass substrate 310 and then cured by using a laser, a deformation may occur due to different thermal expansion coefficients between a metallic material and a glass material. Accordingly, when the cover layer 352 formed of a material similar to that for forming the glass substrate 310 is stacked on the metal layer 351 and the frit 340 is filled and cured between the cover layer 352 and the glass substrate 310, a frit encapsulation structure capable of preventing deformation and providing excellent pressure resistance and vapor permeability resistance may be obtained.

In this case, the cover layer 352 of the encapsulation substrate 350 may be formed of a low-quality glass material instead of a high-quality glass material for forming the glass substrate 310. An example of a low-quality glass material is soda lime glass. Soda lime glass may not be used to form the glass substrate 310 because sodium significantly contained therein may permeate into the light emission unit 320 during a manufacturing process, but may be appropriately used to form the cover layer 352 because the metal layer 351 blocks a surface of the cover layer 352 facing the light emission unit 320. Accordingly, a price may be more advantageous in comparison to a typical case.

Also, as the sealant 360 is filled in a partial region between the metal layer 351 and the glass substrate 310, an encapsulation structure may be formed more firmly together with the frit 340.

Furthermore, as the desiccant 370 is filled inside, the light emission unit 320 may be further protected against moisture.

Therefore, the flat panel display device 300 and the encapsulation substrate 350 may provide an encapsulation structure having excellent vapor permeability resistance and heat radiation capacity.

As described above, according to the present invention, pressure resistance and vapor permeability resistance of a flat panel device may be improved and thus deterioration of a light emission unit due to permeation of moisture may be prevented. Also, heat radiation capacity may be improved and thus deterioration in performance of a product may be prevented.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A flat panel display device comprising:
a glass substrate;
a light emission unit formed on the glass substrate;
a passivation layer covering exposed surfaces of the light emission unit;
an encapsulation substrate, the encapsulation substrate comprising:
   a metal layer, and
   a glass cover layer stacked on the metal layer;
a frit bonding the glass substrate to the glass cover layer, the fit surrounding peripheral edges of the metal layer and the passivation layer;
a sealant disposed in a partial region extending inwardly from the frit and between the metal layer and the glass substrate; and
a desiccant disposed in a remaining region extending inwardly from the partial region and between the metal layer and the glass substrate, the desiccant covering, by contact, exposed surfaces of the passivation layer, the sealant, the metal layer and the glass substrate.

2. The flat panel display device of claim 1, wherein the fit is a glass material.

3. The flat panel display device of claim 1, wherein the metal layer comprises stainless steel or aluminum.

4. The flat panel display device, of claim 1 wherein the glass cover layer comprises soda lime glass.

5. The flat panel display device of claim 1, wherein the metal layer is formed on an inner side of the encapsulation substrate so as to face the glass substrate, and
wherein a surface area of the glass cover layer is greater than a surface area of the metal layer.

6. The flat panel display device of claim 1, wherein the sealant is separated from the passivation layer.

7. A flat panel display device comprising:
a glass substrate;
a light emission unit formed on the glass substrate;
a passivation layer covering all exposed surfaces of the light emission unit;
a desiccant covering, by contact, all exposed surfaces of the passivation layer;
a sealant disposed on peripheral surfaces of the desiccant;
a metallic layer disposed on upper surfaces of the desiccant and the sealant;
a frit surrounding the metal layer and the sealant; and
a glass cover layer disposed on the metallic layer and frit, the frit bonding the glass substrate to the glass cover layer.

8. The flat panel display device of claim 7, the frit being a glass material.

9. The flat panel display device of claim 7, the metallic layer comprising stainless steel or aluminum.

10. The flat panel display device of claim 7, the glass cover layer comprising soda lime glass.

11. A method of forming a flat panel display device comprising:
forming a glass substrate;
forming a light emission unit on the glass substrate;
covering, by contact, all exposed surfaces of the light emission unit with a passivation layer;
covering, by contact, all exposed surfaces of the passivation layer with a desiccant;
covering, by contact, side surfaces of the desiccant with a sealant;
disposing a metallic layer on upper surfaces of the sealant and the desiccant;
surrounding the metal layer and the sealant with a frit; and
disposing a glass cover layer on the metallic layer and frit, the frit bonding the glass substrate to the glass cover layer.

12. The method of forming the flat panel display device of claim 11, the frit being a glass material.

13. The method of forming the flat panel display device of claim 11, the metallic layer comprising stainless steel or aluminum.

14. The method of forming the flat panel display device of claim 11, the glass cover layer comprising soda lime glass.

* * * * *